(12) United States Patent
Watanabe et al.

(10) Patent No.: US 7,026,887 B2
(45) Date of Patent: Apr. 11, 2006

(54) HIGH-FREQUENCY COMPOSITE PART AND WIRELESS COMMUNICATIONS DEVICE COMPRISING IT

(75) Inventors: Mitsuhiro Watanabe, Tottori-ken (JP); Shigeru Kemmochi, Saitama-ken (JP); Tsuyoshi Taketa, Tottori-ken (JP); Hiroyuki Tai, Tottori-ken (JP); Satoru Yokouchi, Tottori-ken (JP)

(73) Assignee: Hitachi Metals, LTD, Tokyo (JP)

( * ) Notice: Subject to any disclaimer, the term of this patent is extended or adjusted under 35 U.S.C. 154(b) by 25 days.

(21) Appl. No.: 10/972,004

(22) Filed: Oct. 25, 2004

(65) Prior Publication Data

US 2005/0077980 A1    Apr. 14, 2005

Related U.S. Application Data

(63) Continuation of application No. 09/979,023, filed on Nov. 15, 2001, now Pat. No. 6,847,269.

(30) Foreign Application Priority Data

Nov. 1, 2000    (JP) .............................. 2000-334621

(51) Int. Cl.
    *H01P 5/12* (2006.01)
(52) U.S. Cl. ...................... 333/126; 333/129; 333/132; 333/134
(58) Field of Classification Search ................ 333/126, 333/129, 134, 132
    See application file for complete search history.

(56) References Cited

U.S. PATENT DOCUMENTS

| 3,068,424 | A |   | 12/1962 | Orloff et al. |
|-----------|---|---|---------|---------------|
| 4,637,130 | A | * | 1/1987  | Fujii et al. ..................... 29/827 |
| 4,999,593 | A |   | 3/1991  | Anderson |
| 5,066,930 | A |   | 11/1991 | Morse |
| 5,392,010 | A | * | 2/1995  | Nakahara ..................... 333/161 |
| 5,450,046 | A | * | 9/1995  | Kosugi et al. .............. 333/246 |
| 5,513,382 | A | * | 4/1996  | Agahi-Kesheh et al. ...... 455/83 |
| 5,554,865 | A |   | 9/1996  | Larson |
| 5,696,466 | A | * | 12/1997 | Li .............................. 330/286 |

(Continued)

FOREIGN PATENT DOCUMENTS

| JP | 2-63201   | 3/1990  |
| JP | 02-108301 | 4/1990  |
| JP | 6-291696  | 10/1994 |

(Continued)

*Primary Examiner*—Robert Pascal
*Assistant Examiner*—Kimberly Glenn
(74) *Attorney, Agent, or Firm*—Finnegan, Henderson, Farabow, Garrett & Dunner, LLP

(57) ABSTRACT

A high-frequency module is connected to a transmitting circuit, a receiving circuit, and an antenna to control the connections between the transmitting circuit and the antenna and between the receiving circuit and the antenna. The module includes means for controlling transmitted signals, which includes a first phase-shift circuit and a high-frequency amplifier provided between the antenna and the transmitting circuit. The high-frequency amplifier and the first phase-shift circuit are integrated into a module composed of a plurality of dielectric layers.

8 Claims, 12 Drawing Sheets

U.S. PATENT DOCUMENTS

| | | |
|---|---|---|
| 5,815,052 A | 9/1998 | Nakajima et al. |
| 6,163,221 A | 12/2000 | Matsuno |
| 6,320,462 B1 | 11/2001 | Alley |
| 6,346,859 B1 | 2/2002 | Saitou |
| 6,366,564 B1 * | 4/2002 | Hiraka et al. ............... 370/275 |
| 6,437,649 B1 | 8/2002 | Miyashita et al. |
| 6,472,952 B1 * | 10/2002 | Sakai et al. ................. 333/126 |
| 6,525,624 B1 | 2/2003 | Hikita et al. |
| 6,800,920 B1 * | 10/2004 | Nishijima ................... 257/531 |

FOREIGN PATENT DOCUMENTS

| | | |
|---|---|---|
| JP | 9-270732 | 10/1997 |
| JP | 11-186803 | 7/1999 |
| JP | 11-225088 | 8/1999 |
| JP | 11-225089 | 8/1999 |
| JP | 11-274804 | 10/1999 |
| JP | 11-313003 | 11/1999 |
| JP | 2000-307303 | 11/2000 |

* cited by examiner

Transmitting Signal Control Means
Receiving Signal Control Means

High-Frequency Amplifier
First Phase-Shifting Circuit

Distributed Constant Line

M1: 880MHz
M2: 915MHz
M3: 925MHz
M4: 960MHz

M1: 880MHz
M2: 915MHz
M3: 925MHz
M4: 960MHz

HIGH-FREQUENCY COMPOSITE PART AND WIRELESS COMMUNICATIONS DEVICE COMPRISING IT

This application is a continuation of application Ser. No. 09/979,023, filed Nov. 15, 2001 now U.S. Pat. No. 6,847,269, which is incorporated herein in its entirety by reference.

FIELD OF THE INVENTION

The present invention relates to a high-frequency composite part used in high-frequency bands such as microwave bands, etc., particularly to a high-frequency composite part for controlling signal lines among a transmitting circuit, a receiving circuit and an antenna in a high-frequency circuit of a digital mobile phone, etc., and a wireless communications device comprising such a high-frequency composite part.

BACKGROUND OF THE INVENTION

Wireless communications devices, for instance, mobile phones have become popular remarkably in recent years with their functions and services improved increasingly. Taking a mobile phone as an example, there are various systems for mobile phones, for instance, EGSM (Extended Global System for Mobile Communications) and DCS1800 (Digital Cellular System 1800) systems widely used mostly in Europe, a PCS (Personal Communications Services) system used in the U.S., and a PDC (Personal Digital Cellular) system used in Japan. In such mobile phones of digital communications systems, high-frequency switches are used to switch the connection between a transmitting circuit and an antenna and the connection between a receiving circuit and an antenna.

One example of the high-frequency switches is disclosed by Japanese Patent Laid-Open No. 2-108301. This high-frequency switch comprises a diode placed between a transmitting circuit and an antenna, and a λ/4 phase shift line placed between an antenna and a receiving circuit, the receiving circuit side of the λ/4 phase shift line being grounded via a diode, thereby constituting a λ/4-type switch circuit for switching signal paths by a bias current flowing through each diode.

According to recent rapid expansion of mobile phones, however, a frequency band allocated to each system cannot allow all users to use their mobile phones in major cities in advanced countries, resulting in difficulty in connection and thus causing such a problem that mobile phones are sometimes disconnected during communication. Thus, proposal was made to permit users to utilize a plurality of systems, thereby increasing substantially usable frequencies, and further to expand serviceable territories and to effectively use communications infrastructure of each system.

In such circumstances, dual-band mobile phones, triple-band mobile phones, etc. have been proposed as mobile phones having new systems. While a usual mobile phone comprises only one transmitting/receiving system, the dual-band mobile phone comprises two transmitting/receiving systems, and the triple-band mobile phone comprises three transmitting/receiving systems. With these structures, users can choose and utilize available transmitting/receiving systems among a plurality of systems. In the dual-band mobile phone and the triple-band mobile phone, there is a high-frequency switch for switching the connection between an antenna and a transmitting circuit or a receiving circuit by time division, so that bi-directional communications can be carried out with one antenna shared in transmitting/receiving systems.

The inventors already proposed in Japanese Patent Laid-Open Nos. 11-225089 and 11-313003 a high-frequency switch module comprising a combination of a branching circuit (diplexer) for separating high-frequency signals of a plurality of frequency bands and a high-frequency switch, with a function of switching the transmitting circuit and the receiving circuit of a plurality of communications systems as a high-frequency switch capable of utilizing a plurality of communications systems, the high-frequency switch module being constituted by a multi-layered module integrated with the branching circuit (diplexer) the high-frequency switch circuit, etc.

FIG. 21 shows an equivalent circuit of a high-frequency switch disclosed by Japanese Patent Laid-Open No. 2-108301. To connect an antenna terminal ANT to a transmitting circuit TX, positive voltage is given from a power supply means (control circuit) to a terminal VC1. With a DC signal cut by capacitors 70, 71, 73, 74 and 79, positive voltage given by the control circuit is applied to a circuit comprising diodes 77, 78 to turn the diodes 77, 78 to an ON state. With the diode 77 in an ON state, there is low impedance between the transmitting circuit TX and the connection point IP1. Also, with a diode 78 in an ON state, the distributed constant line 75 is grounded at high frequencies, causing resonance, resulting in the extremely high impedance of the receiving circuit RX viewed from the side of the connection point IP1. As a result, the transmitting signal from the transmitting circuit TX is sent to the antenna terminal ANT without leaking to the receiving circuit RX.

However, because the diode 77 placed in series between the antenna terminal ANT and the transmitting circuit TX acts as a resistor in an ON state, the transmitting signal suffers from large loss. Because the diode through which a bias current should flow at transmitting consumes electricity from the battery, the mobile phone has a short period of communicatable time, resulting in difficulty in achieving low electricity consumption. Further, because parts such as diodes and capacitors for cutting a DC signal are needed, high-frequency switch modules are constituted by inevitably large multi-layered modules, making it difficult to provide small and lightweight wireless communications devices of dual band or more.

OBJECTS OF THE INVENTION

Accordingly, an object of the present invention is to provide a small and lightweight high-frequency composite part for controlling signal lines between a transmitting circuit, a receiving circuit and an antenna in a wireless communications device such as a mobile phone, etc., which has a simple circuit structure excellent in the insertion loss of a transmitting signal with low power consumption.

Another object of the present invention is to provide a small wireless communications device such as a mobile phone, etc. comprising such a high-frequency composite part.

DISCLOSURE OF THE INVENTION

As shown in FIG. 1, the present invention provides a high-frequency composite part connected among a transmitting circuit TX, a receiving circuit RX and an antenna ANT, comprising a transmitting signal control means 2 for controlling the connection between the transmitting circuit TX and the antenna ANT, and a receiving signal control means 3 for controlling the connection between the receiving circuit RX and the antenna ANT, the transmitting signal control means 2 and the receiving signal control means 3 cooperating to switch signal paths of a high-frequency signal transmitted or received through the antenna ANT.

An important feature of this high-frequency composite part is that the transmitting signal control means 2 is constituted by a high-frequency amplifier and a phase-shifting circuit. FIG. 2 is a block diagram showing the circuit of the transmitting signal control means 2. The high-frequency amplifier 4 has impedance of substantially 50 Ω at work in a frequency band of a transmitting signal, while it is in a substantially short-circuited state at a stop in a frequency band of a receiving signal. The first phase-shifting circuit 5 controls the phase angle of the high-frequency signal.

Without the first phase-shifting circuit 5, the high-frequency amplifier 4 has impedance corresponding to a substantially short-circuited state at a stop, so that the receiving signal from the antenna ANT is absorbed by the high-frequency amplifier 4. With the first phase-shifting circuit 5, however, the receiving signal from the antenna ANT is phase-shifted, so that the impedance of the transmitting signal control means 2 viewed from the antenna side becomes a substantially open state while the high-frequency amplifier 4 is at a stop. Accordingly, the receiving signal is sent to the receiving circuit RX without leaking to the transmitting circuit TX.

Therefore, the high-frequency composite part of the present invention is connected among the transmitting circuit, the receiving circuit and the antenna for switching the connection between the transmitting circuit and the antenna and the connection between the receiving circuit and the antenna, comprising a transmitting signal control means comprising a first phase-shifting circuit and a high-frequency amplifier between the antenna and the transmitting circuit, the high-frequency amplifier and the first phase-shifting circuit being integrated in a multi-layered module constituted by a plurality of dielectric layers.

The phase-shifting circuit is a circuit for controlling the angle of a phase moved to control the impedance of the transmitting signal control means and the receiving signal control means at desired levels. The first phase-shifting circuit comprises a distributed constant line. The first phase-shifting circuit may have various structures, and in the simplest structure the first phase-shifting circuit is constituted by a distributed constant line having such a line length that the impedance of the transmitting signal control means viewed from the antenna side is in a substantially short-circuited state in a frequency band of a receiving signal.

The high-frequency amplifier comprising gallium arsenide GaAs semiconductor chips has such impedance characteristics that it has impedance of substantially 50 Ω at work in a frequency band of a transmitting signal, while it is in a substantially short-circuited state at a stop in a frequency band of a receiving signal. The first phase-shifting circuit may be constituted by a distributed constant line having a line length of substantially $\lambda/4$, wherein $\lambda$ is the wave length of a receiving signal, and the line length is an effective length of a line in a spiral or meander type, etc. Because the actual line length may change depending on the wave length-shortening effects of the line and dielectric constant of a multi-layered module constituting the distributed constant line, etc., the line length is preferably set in a range of $\lambda/10$–$\lambda/4$.

The first phase-shifting circuit in another embodiment comprises a directional coupler for monitoring part of a transmitting signal amplified by the high-frequency amplifier, and the main line of the directional coupler is preferably at least part of the distributed constant line. The first phase-shifting circuit may comprise a detector for detecting part of the branched transmitting signal. In the preferred embodiment, the detector comprises a detecting diode and a smoothing capacitor, the detecting diode being mounted onto the multi-layered module, and the smoothing capacitor being formed by capacitor electrodes opposing via a dielectric layer inside the multi-layered module.

In each of the above embodiments, the first phase-shifting circuit keeps the impedance of the transmitting signal control means viewed from the antenna side in a substantially open state in a frequency band of a receiving signal, while the high-frequency amplifier is at a stop.

The high-frequency amplifier in the high-frequency composite part of the present invention preferably comprises an amplifier circuit comprising a transistor, an input-matching circuit connected to the input terminal of the amplifier circuit, and an output-matching circuit connected to the output terminal of the amplifier circuit, each of the input-matching circuit and the output-matching circuit comprising a capacitor and an inductor, the transistor of the amplifier circuit being mounted onto the multi-layered module, and the inductors being formed as distributed constant lines inside the multi-layered module. The capacitor is preferably formed by electrodes opposing via a dielectric layer inside the multi-layered module. The above transistor is a field effect transistor, and the high-frequency amplifier is made of gallium arsenide GaAs, these parts being mounted onto the multi-layered module.

In another preferred embodiment of the present invention, the high-frequency composite part comprises a receiving signal control means comprising a second phase-shifting circuit and a band pass filter between the antenna and the receiving circuit, the second phase-shifting circuit and the band pass filter cooperating to keep the impedance of the receiving signal control means viewed from the antenna side in a substantially open state in a frequency band of a transmitting signal. Preferably usable as the passband filter is a surface acoustic wave filter, a multi-layered-type dielectric filter, a coaxial resonator filter or a bulk-wave filter.

In a further preferred embodiment of the present invention, the high-frequency composite part comprises a receiving signal control means between an antenna and a receiving circuit, the receiving signal control means comprising a distributed constant line and a diode connected between the distributed constant line and the receiving circuit and grounded via a capacitor. In the preferred embodiment, the diode is mounted onto the multi-layered module, and the distributed constant line is formed inside the multi-layered module.

The high-frequency composite part according to a further preferred embodiment of the present invention handles a plurality of transmitting/receiving systems of different passbands, comprising a plurality of filter circuits of different passbands connected to the antenna terminal, with a transmitting signal control means comprising a first phase-shifting circuit and a high-frequency amplifier on the downstream side of at least one filter circuit. The high-frequency amplifier and the first phase-shifting circuit are integrally formed inside the multi-layered module constituted by a plurality of dielectric layers. This high-frequency composite part can be used commonly for high-frequency signals for a plurality of communications systems for dual-band, triple-band, etc. in which high-frequency signals of a plurality of frequency bands are commonly used.

Each of the first and second filter circuits is preferably an LC circuit comprising an inductor and a capacitor, the inductor being formed as a distributed constant line inside the multi-layered module, and the capacitor being formed by capacitor electrodes opposing via a dielectric layer inside the multi-layered module.

The first phase-shifting circuit comprises a distributed constant line. The first phase-shifting circuit preferably further comprises a directional coupler for monitoring part of the transmitting signal amplified by the high-frequency amplifier, the main line of the directional coupler being part of a distributed constant line of the first phase-shifting circuit. The first phase-shifting circuit may further comprise a detector for detecting part of the branched transmitting signal. The detector comprises a detecting diode and a smoothing capacitor, the detecting diode being mounted onto the multi-layered module, and the smoothing capacitor being formed by capacitor electrodes opposing via a dielectric layer inside the multi-layered module.

The high-frequency amplifier comprises an amplifier circuit comprising a transistor, an input-matching circuit connected to the input terminal of the amplifier circuit, an output-matching circuit connected to the output terminal of the amplifier circuit, each of the input-matching circuit and the output-matching circuit comprising a capacitor and an inductor. It is preferable that the transistor of the amplifier circuit is mounted onto the multi-layered module, and that the inductor is formed as a distributed constant line inside the multi-layered module. The capacitor is preferably formed by capacitor electrodes opposing via a dielectric layer inside the multi-layered module. The transistor of the amplifier circuit is preferably a field effect transistor. The high-frequency amplifier is preferably constituted by a gallium arsenide GaAs transistor and mounted onto the multi-layered module.

The wireless communications device of the present invention comprises the above high-frequency composite part.

THE BEST MODE FOR CARRYING OUT THE INVENTION

The preferred embodiments of the present invention are explained in detail below referring to the attached figures. For the simplicity of explanation, EGSM (transmitting frequency: 880–915 MHz, receiving frequency: 925–960 MHz) is taken as an example of the first signal frequency band f1. Of course, the present invention can be applied to other communications systems such as a DCS 1800 system (transmitting TX: 1710–1785 MHz, receiving RX: 1805–1880 MHz), a PCS system (transmitting TX: 1850–1910 MHz, receiving RX: 1930–1990 MHz), etc.

[1] Constitution of High-Frequency Composite Part

Figure 1:
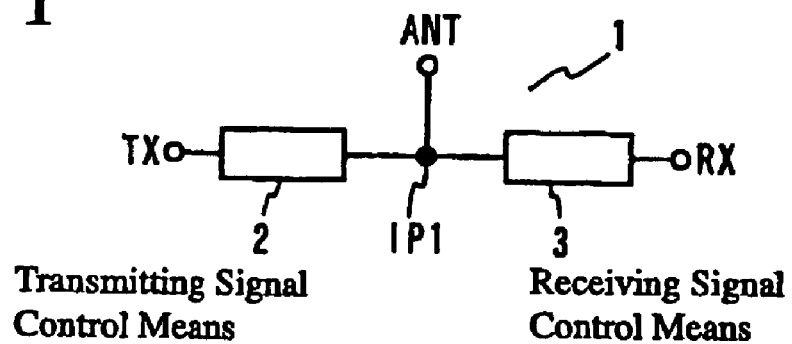
FIG. 1 is a block diagram showing one example of the high-frequency composite part of the present invention.

FIG. 1 is a block diagram showing one example of the high-frequency composite part of the present invention, which may be called "high-frequency switch module." This high-frequency composite part is a single-band high-frequency composite part comprising a transmitting signal control means 2 between a connection point IP1 and a transmitting circuit TX, and a receiving signal control means 3 between the connection point IP1 and a receiving circuit RX.

(A) Transmitting Signal Control Means

Figure 2:
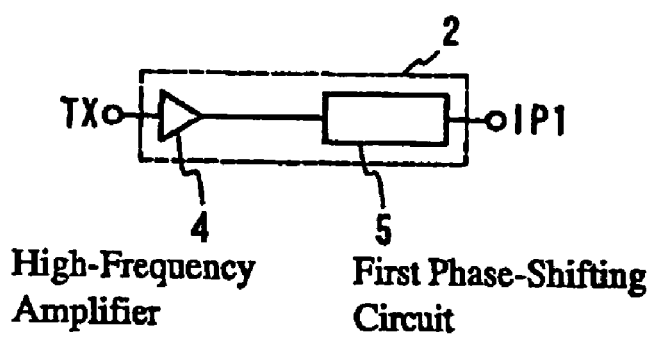
FIG. 2 is a block diagram showing one example of a transmitting signal control means used in the high-frequency composite part of the present invention.

As shown in FIG. 2, the transmitting signal control means 2 comprises a first phase-shifting circuit 5 connected between the connection point IP1 and the transmitting circuit TX, and a high-frequency amplifier 4. The high-frequency amplifier 4 has such impedance characteristics that its impedance is substantially 50 Ω at work in a frequency band of a transmitting signal, and that it is in a substantially short-circuited state at a stop in a frequency band of a receiving signal. The first phase-shifting circuit 5 connected to the high-frequency amplifier 4 controls the angle of phase moved such that the impedance of the transmitting signal control means 2 viewed from the side of the connection point IP1 is a substantially open state.

Figure 6:
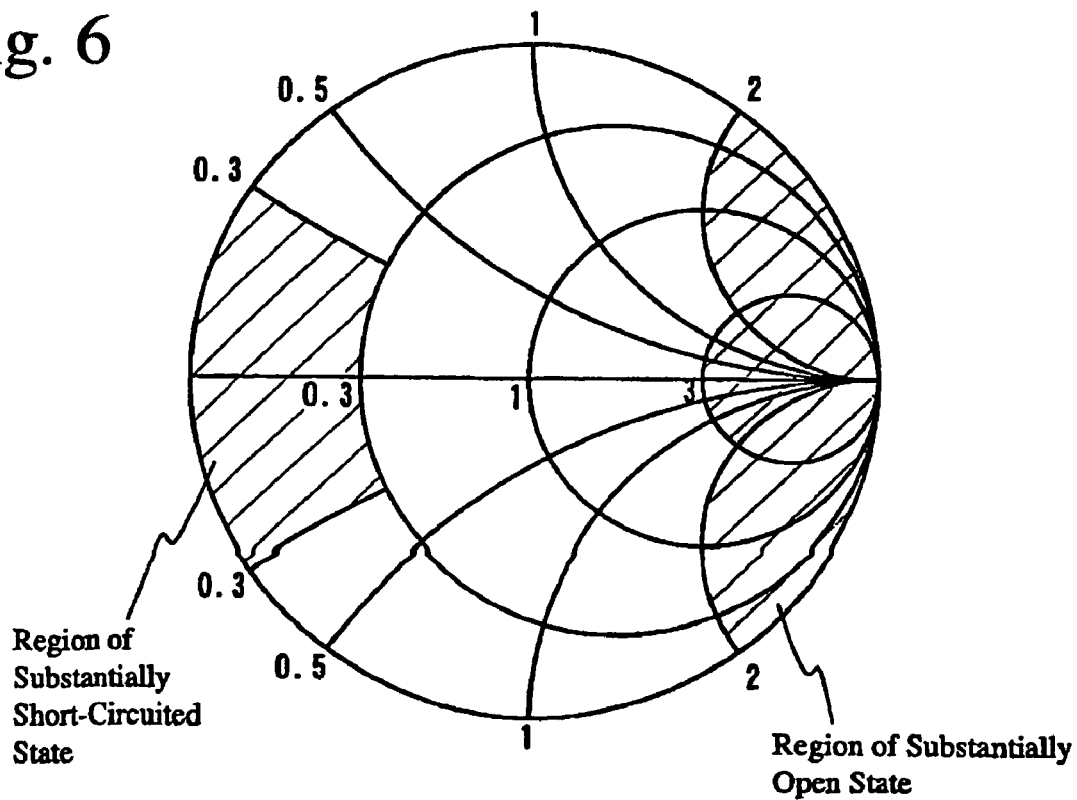
FIG. 6 is a Smith chart showing the impedance characteristics in a substantially short-circuited state and a substantially open state.

The term "substantially short-circuited state" means a case where the real number part R is adjusted to 15 Ω or less, and a case where an absolute value of the imaginary number part X is adjusted to 15 Ω or less, in the impedance Z expressed by Z=R+jX. Expressed in a Smith chart of FIG. 6, for instance, the "substantially short-circuited state" corresponds to a hatched region on the left side. Also, the term "substantially open state" means a case where the real number part R is adjusted to 150 Ω or more, and a case where an absolute value of the imaginary number part X is adjusted to 100 Ω or more, in the impedance Z expressed by Z=R+jX. Expressed in a Smith chart, the "substantially open state" corresponds to a hatched region on the right side in FIG. 6.

The high-frequency amplifier 4 is controlled to be in a substantially short-circuited state (in a hatched portion on the left side in the Smith chart of FIG. 6) at a stop in a frequency band of a receiving signal. The first phase-shifting circuit 5 is controlled such that the impedance of the transmitting signal control means 2 viewed from the side of the connection point IP1 is in a hatched portion on the right side in the Smith chart of FIG. 6. With such a structure, a receiving signal leaking to the transmitting signal control means can be made extremely small.

Figure 3:
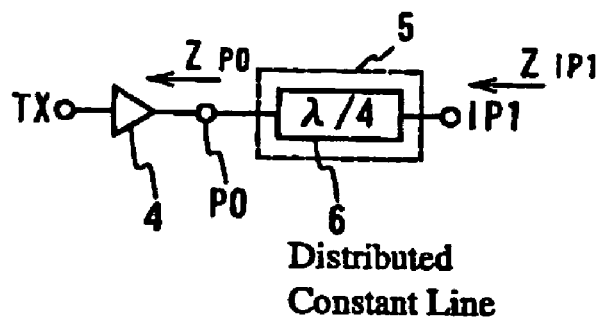
FIG. 3 is a view showing an equivalent circuit of another example of the transmitting signal control means used in the high-frequency composite part of the present invention.
Figure 7A:
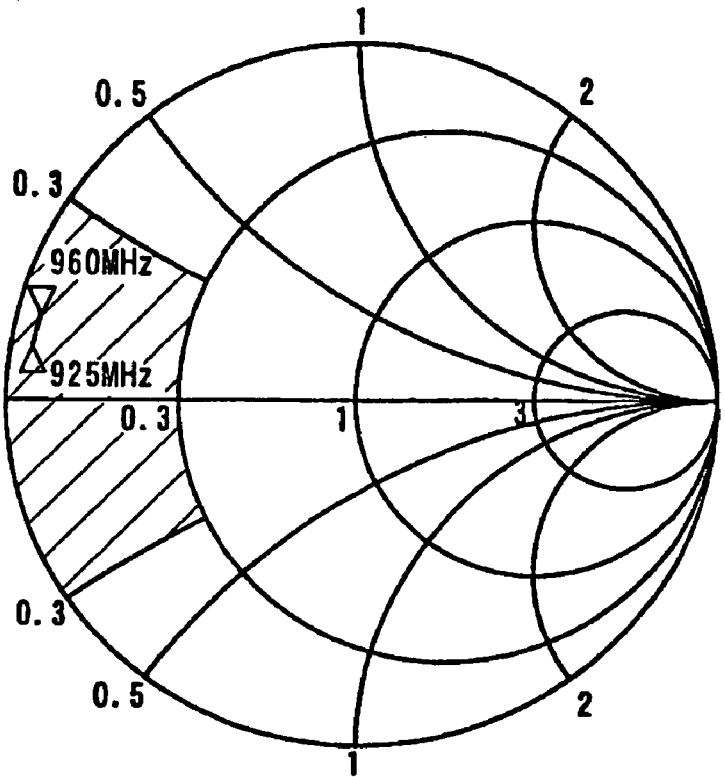
FIG. 7(a) is a Smith chart showing the impedance Zp1 of the high-frequency amplifier viewed from the connection point P0 in the transmitting signal control means of FIG. 3, while the high-frequency amplifier is at a stop.
Figure 7B:
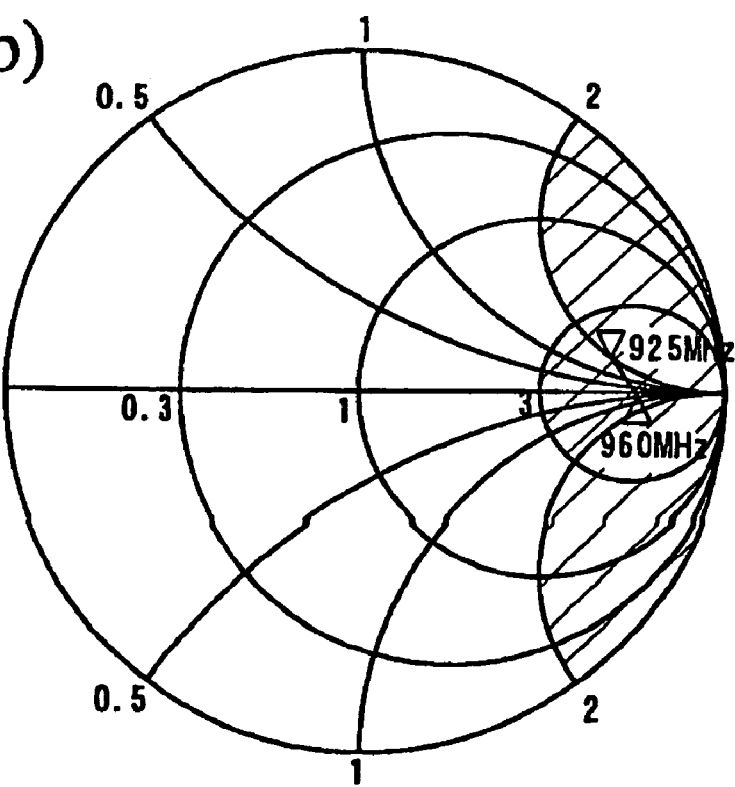
FIG. 7(b) is a Smith chart showing the impedance Zip1 of the transmitting signal control means of FIG. 3 viewed from the connection point IP1 while the high-frequency amplifier is at a stop.

FIG. 3 shows one example of an equivalent circuit of the phase-shifting circuit 5. The phase-shifting circuit 5 is constituted by a distributed constant line 6 whose line length is substantially λ/4 in a frequency band (receiving frequency: 925–960 MHz) of a receiving signal. This phase-shifting circuit is advantageous in that it has a simple structure. FIG. 7(*a*) shows the impedance Zp0 of the high-frequency amplifier 4 viewed from the connection point P0 in the transmitting signal control means 2 of FIG. 3, and FIG. 7(*b*) shows the impedance Zip1 TX of the transmitting signal control means 2 viewed from the connection point IP1. In this case, the high-frequency amplifier 4 is at a state. As is clear from FIGS. 7(*a*) and (*b*), the impedance of the high-frequency amplifier 4 is in a substantially short-circuited state in a frequency band of a receiving signal, while the impedance of the transmitting signal control means 2 viewed from the connection point IP1 is in a substantially open state by the first phase-shifting circuit 5.

Figure 4:
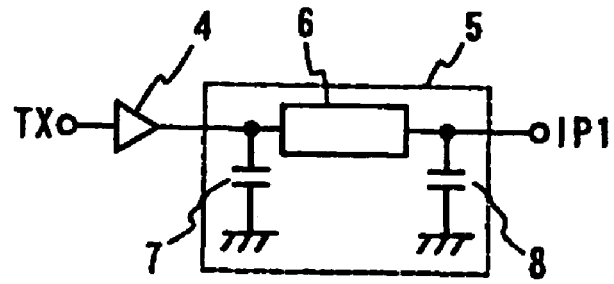
FIG. 4 is a view showing an equivalent circuit of a further example of the transmitting signal control means used in the high-frequency composite part of the present invention.

FIG. 4 is a block diagram showing another example of the phase-shifting circuit 5. In this phase-shifting circuit 5, capacitors 7, 8 are connected to both sides of the distributed constant line 6. The phase-shifting circuit 5 can have a shorter line length than when constituted by the distributed constant line 6 only, with advantages that it functions as a low-pass filter for attenuating harmonic signals from the high-frequency amplifier 4.

Figure 5:
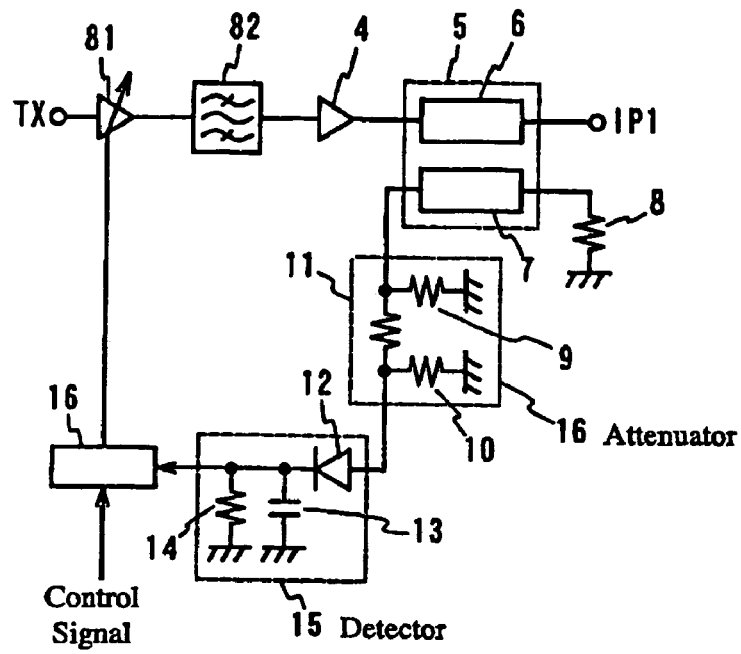
FIG. 5 is a view showing an equivalent circuit of a further example of the transmitting signal control means used in the high-frequency composite part of the present invention.

FIG. 5 shows another example of the phase-shifting circuit 5. The phase-shifting circuit 5 is a directional coupler comprising a distributed constant line 6 as a main line and a distributed constant line 7 as a sub-line. With this phase-shifting circuit 5, part of a transmitting signal from the high-frequency amplifier 4 is taken out from one end of the distributed constant line 7 constituting the phase-shifting circuit 5 (directional coupler), attenuated by an attenuator 16 comprising resistors 9, 10, 11 and supplied to the detector 15. The attenuator 16 attenuates part of the transmitting signal (high-frequency signal) to such electric power that can be handled by a circuit on the downstream side. After the above part of transmitting signal is rectified by a detecting diode 12 in the detector 15, it is subjected to voltage conversion by a smoothing capacitor 13 and a load resistor 14 to generate a detection signal, which is supplied to the control circuit 16. Compared with a control signal of a predetermined transmitting output level, the detection signal is subjected to feedback to a driver amplifier 81 to make this difference small, whereby it is controlled to a targeted transmitting output level.

Figure 18:
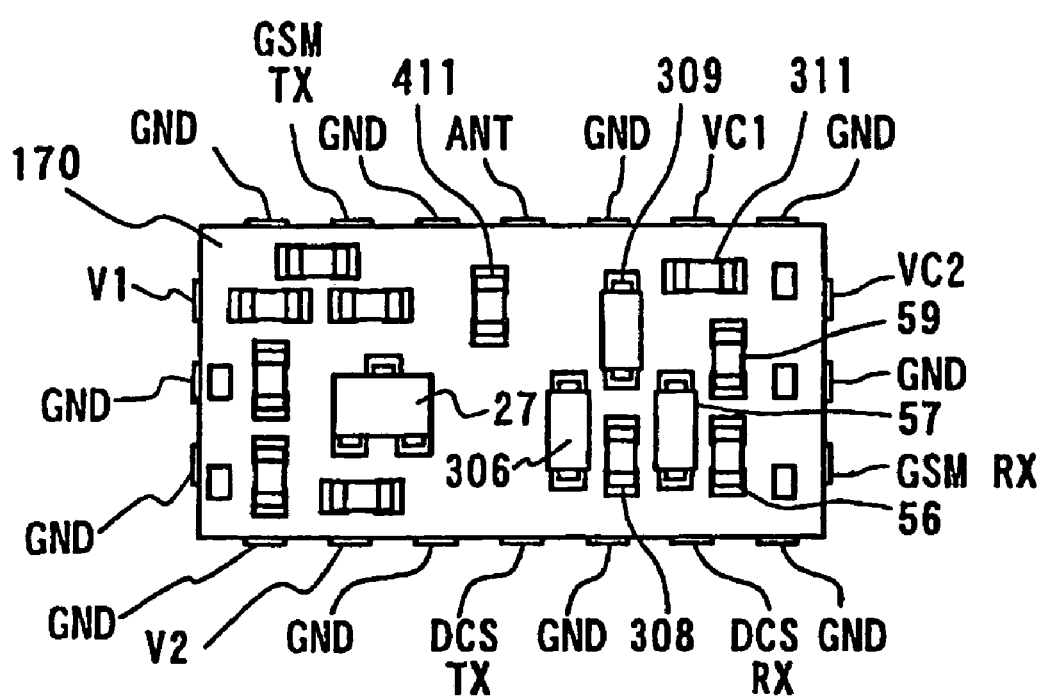
FIG. 18 is a top view showing the appearance of the integral multi-layered module containing the dual-band, high-frequency composite part.

In the present invention, as shown in FIG. 18, the distributed constant line and the capacitor constituting the first phase-shifting circuit are formed by electrode patterns on a plurality of green sheets made of a dielectric material, and green sheets are multi-layered and sintered to form an integral multi-layered module 170, which constitutes a one-chip, high-frequency switch module.

With the attenuator constituted by chip resistors mounted onto the multi-layered module, wires for connecting the phase-shifting circuit and the attenuator can be mounted onto the multi-layered module. In this case, the overall dimension of the high-frequency composite part can be made smaller than when the attenuator is connected to a circuit board onto which the high-frequency switch module is mounted. Also, with the detector 15 constituted such that a chip resistor is mounted as a load resistor 14 onto the multi-layered module, that a smoothing capacitor 13 is formed by capacitor electrodes opposing each other via a dielectric layer inside the multi-layered module, and that a detecting diode 12 is mounted onto the multi-layered module, the overall dimension of the high-frequency composite part can be made smaller than when the detector 15 is connected to the circuit board separately from the multi-layered module.

Because a transistor and MMIC (microwave monolithic integrated circuit) constituting the high-frequency amplifier 4 have large power consumption and heat generation, a temperature-sensing device (thermistor) for compensating temperature variations may be attached to the detector 15 to control the temperature of the detector 15.

Figure 8:
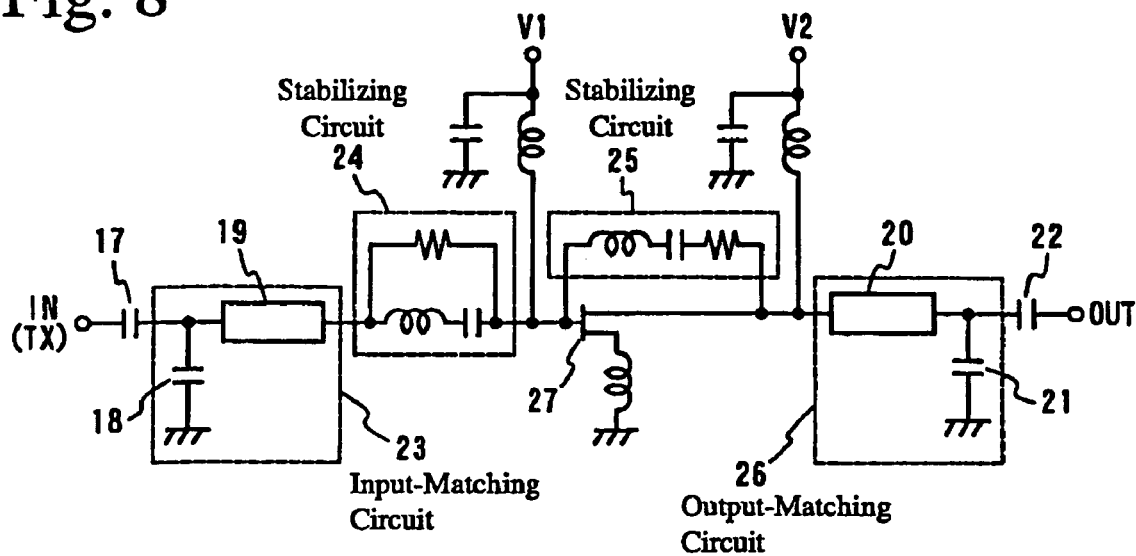
FIG. 8 is a view showing an equivalent circuit of one example of the high-frequency amplifier used in the high-frequency composite part of the present invention.

FIG. 8 shows one example of an equivalent circuit of the high-frequency amplifier 4. The high-frequency amplifier 4 comprises an input-matching circuit 23 comprising an inductor 19 and a capacitor 18, an output-matching circuit 26 comprising an inductor 20 and a capacitor 21, and stabilizing circuits 24, 25 each comprising a resistor, a capacitor and an inductor for preventing oscillation, and a field effect transistor 27.

With the field effect transistor 27 constituting the high-frequency amplifier 4 mounted onto the multi-layered module 170, the inductors constituting the input-matching circuit 23 and the output-matching circuit 26 formed by distributed constant lines, and the capacitors formed by capacitor electrodes opposing each other via a dielectric layer inside the multi-layered module, the overall dimension of the device can be made small.

Figure 20:
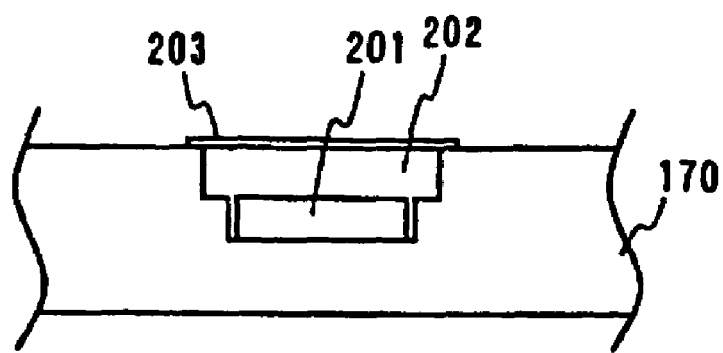
FIG. 20 is a partially cross-sectional view showing an integral multi-layered module containing the high-frequency composite part of the present invention.

As shown in FIG. 20, the multi-layered module 170 may be provided with a cavity 202 in which the transistor 27 constituting the high-frequency amplifier and a semiconductor chip 201 made of gallium arsenide GaAs are mounted. With the opening of the cavity 202 properly sealed with plastics such as epoxy resins or covered by a cap 203, the top surface of the multi-layered module 170 can be made flat to make it easy to handle the multi-layered module 170, thereby stabilizing the characteristics of the high-frequency amplifier.

The transistor and MMIC constituting the high-frequency amplifier 4 have large power consumption and thus large heat generation, with grounded inductance having larger influence on electrical characteristics at higher frequencies. Accordingly, it is important that they have good heat dissipation and sufficiently low grounded inductance. Therefore, the multi-layered module may be provided with via-holes immediately under the high-frequency amplifier 4, such that heat generated from the high-frequency amplifier 4 is dissipated to the circuit board through via-holes. Also, to achieve high heat dissipation and low grounded inductance, metal columns called "bumps" may be formed on the transistor electrodes on the semiconductor chip to use flip chip bonding for bonding the bumps of the semiconductor chip and the electrodes on the circuit board.

(B) Receiving Signal Control Means

Figure 9:
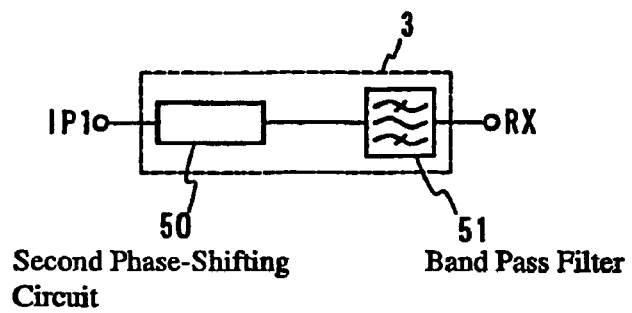
FIG. 9 is a block diagram showing one example of the receiving signal control means used in the high-frequency composite part of the present invention.

As shown in FIG. 9, the receiving signal control means 3 comprises a second phase-shifting circuit 50 connected between the connection point IP1 and the receiving circuit RX, and a band pass filter 51. The second phase-shifting circuit 50 connected to the band pass filter 51 controls the phase angle of the high-frequency signal, to keep the impedance of the receiving signal control means 3 viewed from the side of the connection point IP1 in a substantially open state.

Figure 10:
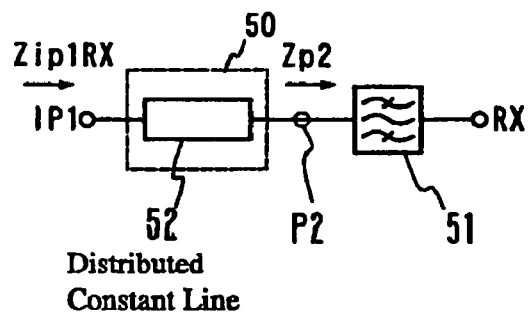
FIG. 10 is a view showing one example of an equivalent circuit of the receiving signal control means used in the high-frequency composite part of the present invention.
Figure 11A:
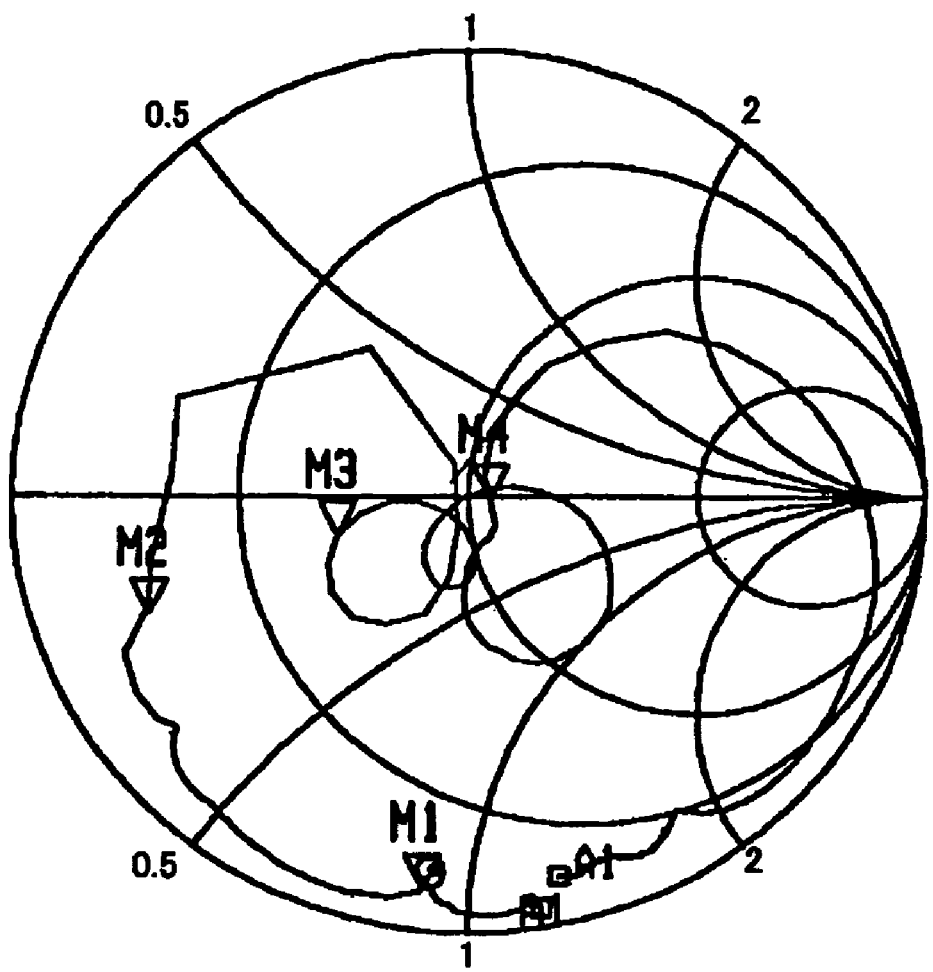
FIG. 11(a) is a Smith chart showing the impedance Zp2 of the band pass filter used in the high-frequency composite part of the present invention.
Figure 11B:
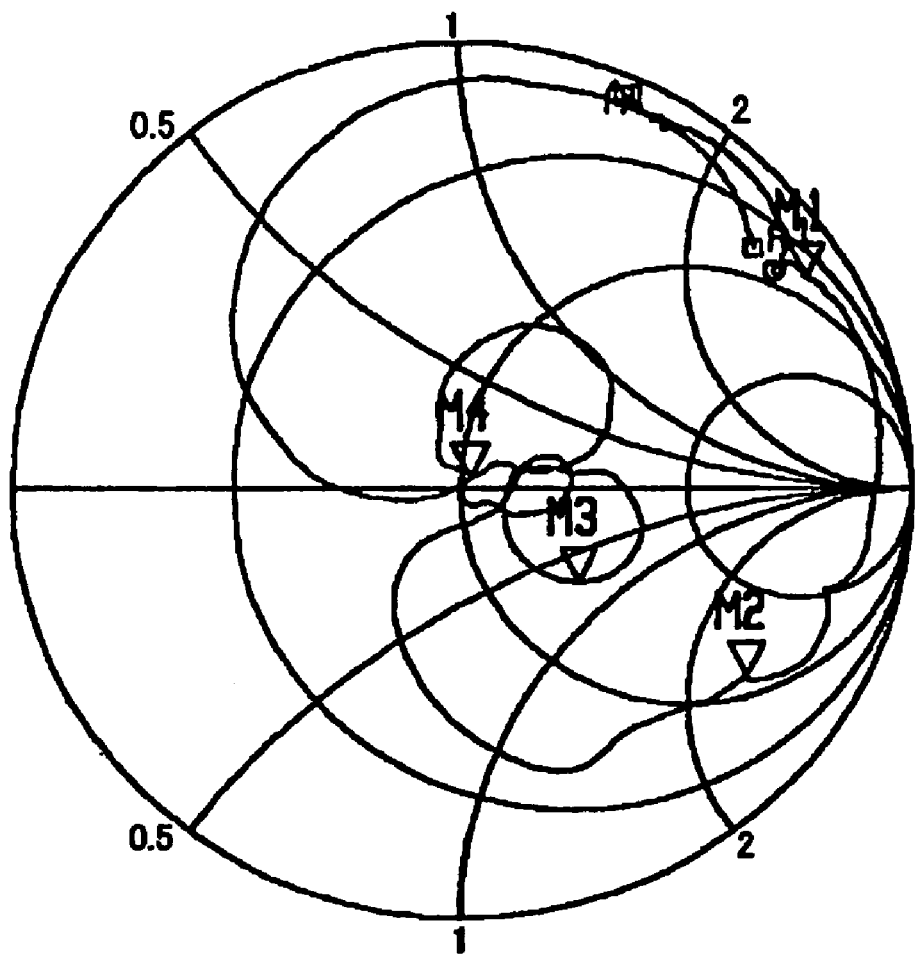
FIG. 11(b) is a Smith chart showing the impedance Zip1 of the receiving signal control means in the high-frequency composite part of the present invention.

FIG. 10 shows one example of an equivalent circuit of a phase-shifting circuit 50, in which the second phase-shifting circuit is constituted by a distributed constant line. Usable as the band pass filter 51 is a surface acoustic wave filter, a multi-layered-type dielectric filter, a coaxial resonator filter or a bulk-wave filter. FIG. 11(a) shows the impedance Zp2 of a surface acoustic wave filter (SAW). The surface acoustic wave filter has impedance of substantially 50 Ω in a receiving frequency passband of a receiving signal, while it has low impedance in a transmitting frequency of a transmitting signal. The phase-shifting circuit 50 is constituted by a distributed constant line 52 having a line length of substantially 5 λ/16 in a frequency band of a transmitting signal (transmitting frequency: 880–915 MHz), and as shown in FIG. 11(b), the impedance Zip1 RX of the receiving signal control means 3 corresponds to a substantially open state in a frequency band of a transmitting signal.

Figure 13:
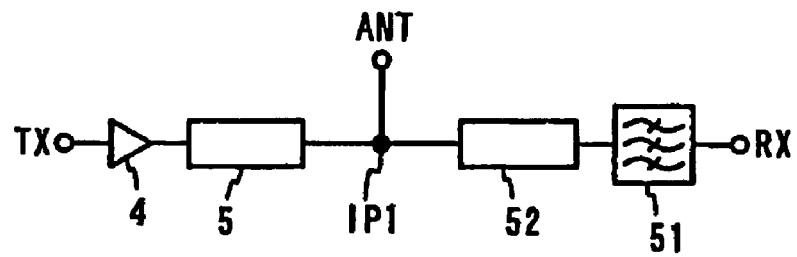
FIG. 13 is a view showing an equivalent circuit of one example of the high-frequency composite part of the present invention.

FIG. 13 shows an equivalent circuit of the high-frequency composite part comprising a combination of a receiving signal control means 3 and a transmitting signal control means 2. With such a structure, it is possible to extremely reduce the leakage of a transmitting signal to the receiving signal control means with its structure extremely simplified. Without diodes, there is decreased insertion loss between the transmitting circuit TX and the antenna ANT, resulting in decrease in current consumption.

Figure 12:
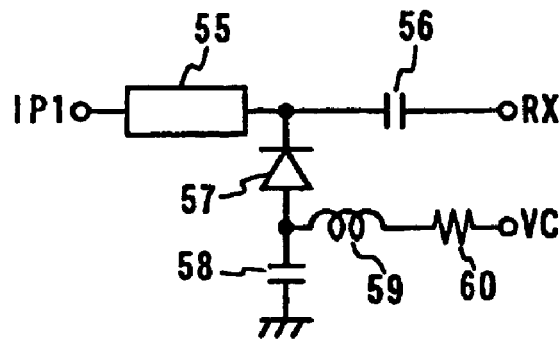
FIG. 12 is a view showing an equivalent circuit of a further example of the receiving signal control means used in the high-frequency composite part of the present invention.

FIG. 12 shows another example of an equivalent circuit of the receiving signal control means 3. In the receiving signal control means 3, a distributed constant line 55 is connected between the connection point IP1 and RX, with one end of the distributed constant line 55 on the side of the receiving circuit RX connected to the cathode of a diode 57, and with a capacitor 58 connected between the anode of the diode 57 and a ground. A series circuit comprising an inductor 59 and a resistor 60 is connected between the anode of the diode 57 and the control circuit VC1. The resistor 60 controls current while the diode 57 is in an ON state. The inductor 59 functions to enlarge the impedance of the control circuit VC1 viewed from the side of the anode of the diode 57, though the inductor 59 may be omitted. In this embodiment, the distributed constant line 55 has such a line length that its resonance frequency is in a frequency band of a transmitting signal of EGSM.

Figure 14:
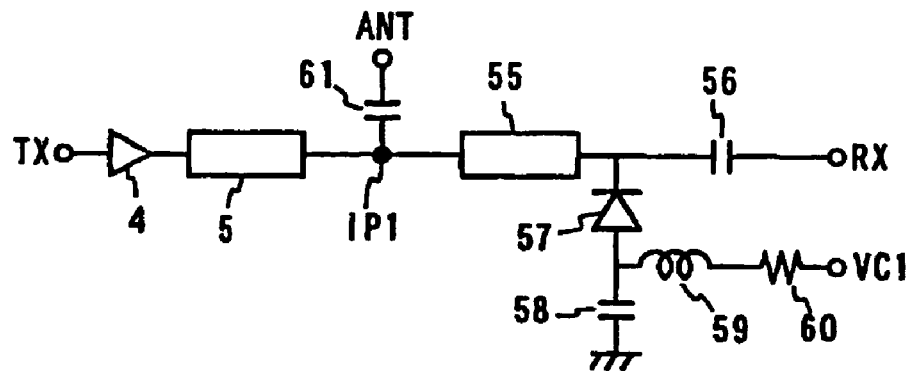
FIG. 14 is a view showing an equivalent circuit of a further example of the high-frequency composite part of the present invention.

FIG. 14 shows one example of an equivalent circuit of the high-frequency composite part comprising a combination of the receiving signal control means 3 and the transmitting signal control means 2. The high-frequency composite part is provided with a current path (not shown) for leading current to a ground. In this high-frequency switch module, the diode 57 is turned on by forward bias voltage from the control circuit VC1 and resonates by the grounding of the distributed constant line 55 by the diode 57 to make the impedance of the receiving circuit RX viewed from the side of the connection point IP1 extremely large, so that the transmitting signal of the transmitting circuit TX is not transmitted to the receiving circuit RX.

(C) Operation

The high-frequency switch module of the present invention selects transmitting or receiving in the transmitting/receiving system by the operation of the high-frequency amplifier 4. With respect to the high-frequency composite part having an equivalent circuit shown in FIGS. 13 and 14, operation will be explained in detail below.

(1) High-Frequency Composite Part of FIG. 13

(a) EGSM TX Mode

When the transmitting circuit TX is connected to the antenna ANT, the high-frequency amplifier 4 is at work. Because the high-frequency amplifier 4 has impedance of substantially 50 Ω at work, the transmitting signal is sent to the connection point IP1 via the distributed constant line. Because the impedance of the receiving signal control means 3 viewed from the connection point IP1 in a frequency band of a transmitting signal is a substantially open state (high impedance) by the distributed constant line 52 and the surface acoustic wave filter 51, the transmitting signal is sent to the antenna ANT without leaking to the receiving circuit.

(b) EGSM RX Mode

When the antenna ANT is connected to the receiving circuit RX, the high-frequency amplifier 4 is at a stop. Though the impedance of the high-frequency amplifier 4 is in a substantially short-circuited state at a stop in a frequency of a receiving signal, the impedance of the transmitting signal control means 2 viewed from the connection point IP1 in a frequency band of a receiving signal is in a substantially open state (high impedance) by the distributed constant line 5 connected to the high-frequency amplifier 4. Therefore, the receiving signal does not leak to the transmitting circuit TX. The surface acoustic wave filter 51 constituting the receiving signal control means has impedance of substantially 50 Ω in a frequency of a receiving signal. Therefore, the receiving signal passes through the distributed constant line 52 and the surface acoustic wave filter 51 to the receiving circuit RX.

Figure 21:
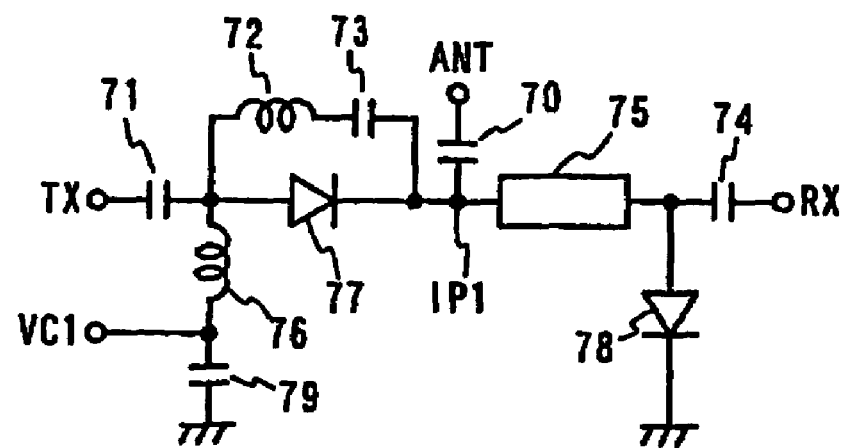
FIG. 21 is a view showing an equivalent circuit of the conventional high-frequency composite part.

Because the high-frequency composite part of the present invention can achieve high isolation characteristics with an extremely simple structure, and because a diode can be omitted in both of the transmitting system and the receiving system, it is possible to suppress the insertion loss of the transmitting signal. Because diodes 77, 78, capacitors 70, 71, 74, 79, an inductor 76, etc. necessary in the conventional high-frequency composite part as shown in FIG. 21 can be omitted, the high-frequency composite part can be miniaturized. In addition, the high-frequency amplifier 4 and the band pass filter 51 separately mounted onto a conventionally circuit board can be integrated, the overall dimension of the high-frequency composite part can be made further smaller. As a result, the wireless communications device comprising the high-frequency composite part can also be made small in size and reduced in weight.

(2) High-Frequency Composite Part of FIG. 14

(a) EGSM TX Mode

To connect the transmitting circuit TX to the antenna ANT, the high-frequency amplifier 4 is operated, and positive voltage is given from the control circuit VC1 to turn on the diode 57. Because the impedance of the high-frequency amplifier 4 is substantially 50 Ω at work, the transmitting signal passes through the distributed constant line to the connection point IP1. Positive voltage provided from the control circuit VCI is applied to the diode 57 with its DC signal cut by the capacitors 56, 58, 61 and the capacitor 22 of the high-frequency amplifier 4, to turn the diode 57 in an ON state. As a result, the diode 57 and the capacitor 58 are resonated with the distributed constant line 55 grounded at high frequencies, resulting in the extremely large impedance of the receiving circuit RX viewed from the side of the connection point IP1, which leads the transmitting signal to the antenna ANT without leaking to the receiving circuit.

(b) EGSM RX Mode

To connect the antenna ANT to the receiving circuit RX, the high-frequency amplifier 4 stops, and zero voltage is provided to the control circuit VC1. Though the impedance of the high-frequency amplifier 4 is in a substantially short-circuited state at a stop in a frequency of a receiving signal, the impedance of the transmitting signal control means 2 viewed from the side of the connection point IP1 in a frequency band of a receiving signal is in a substantially open state (high impedance) by the distributed constant line 5 connected to the high-frequency amplifier 4, so that the receiving signal does not leak to the transmitting circuit TX. With zero voltage applied to the control circuit VC1, the diode 57 is in an OFF state. With the diode 57 in an OFF state, the connection point IP1 is connected to the receiving circuit RX via the distributed constant line 55, so that the receiving signal is transmitted to the receiving circuit RX without leaking to the transmitting circuit TX.

Because in the high-frequency composite part of the present invention, high isolation characteristics can be achieved with an extremely simple structure, and diodes can be omitted from the transmitting system as described above, the insertion loss of the transmitting signal can be suppressed. Because the diode 77, etc. necessary in the conventional high-frequency switch module are not used, the high-frequency switch module can be miniaturized. In addition, the high-frequency amplifier 4 that used to be separately mounted onto the conventional circuit board can be integrated, the overall dimension of the device can be made small, so that the wireless communications device comprising the high-frequency composite part can be made small in size and reduced in weight.

[2] Specific examples of high-frequency composite part

Figure 15:
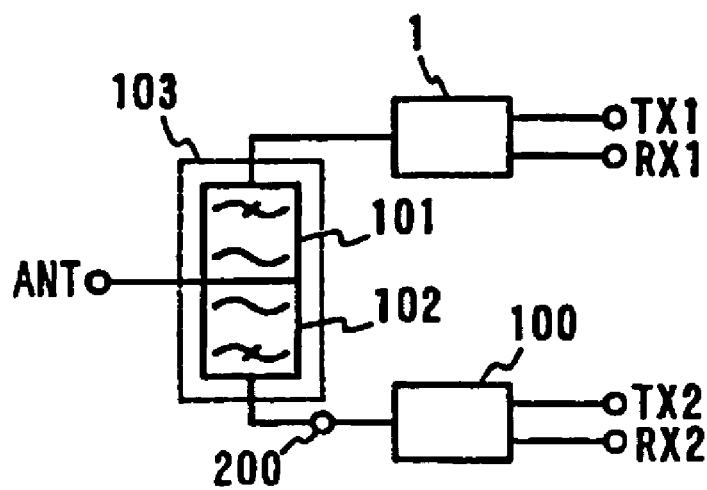
FIG. 15 is a block diagram showing one example of the dual-band, high-frequency composite part of the present invention.
Figure 17:
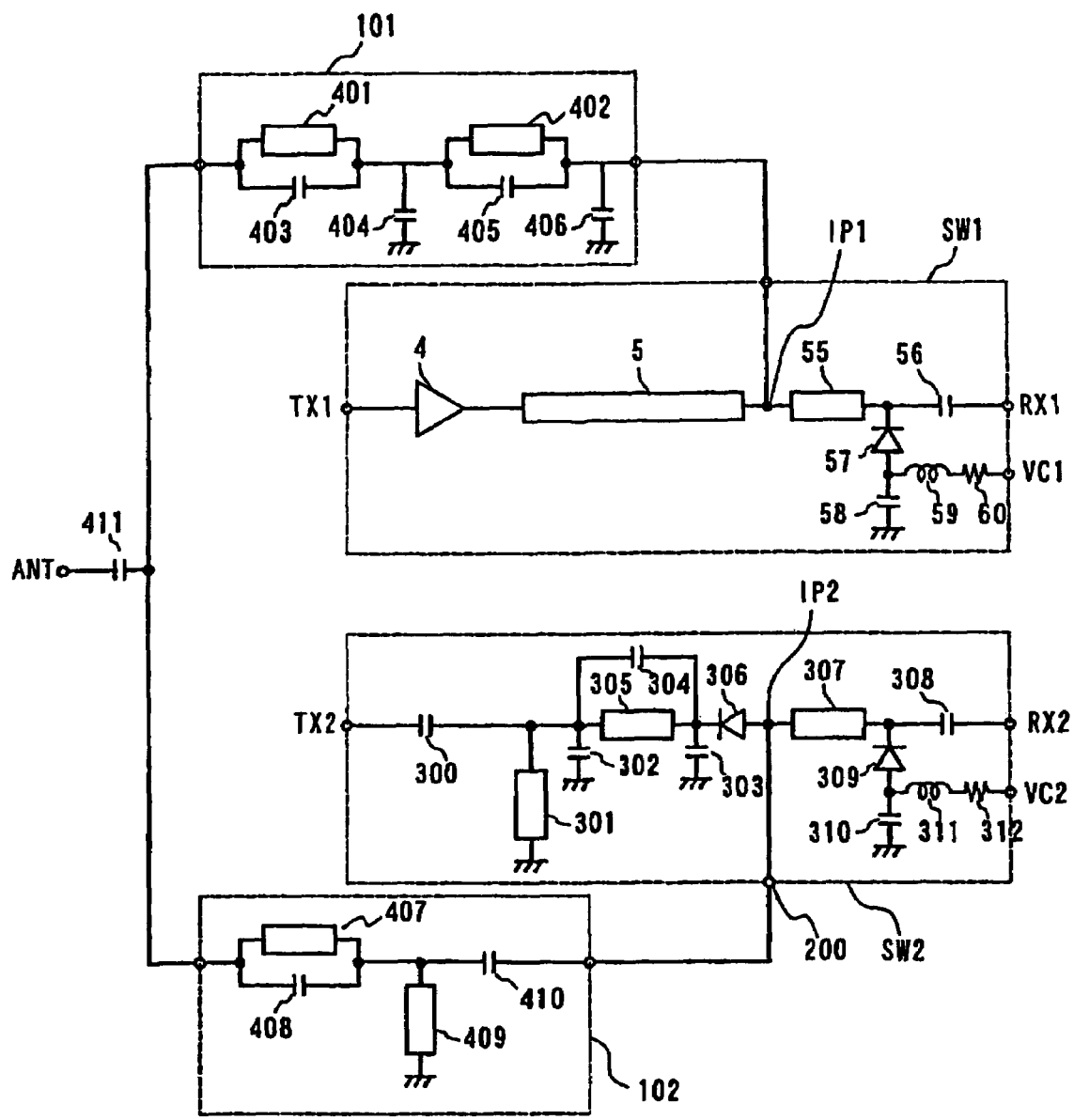
FIG. 17 is a view showing an equivalent circuit of one example of the dual-band, high-frequency composite part of the present invention.

FIG. 15 is a block diagram showing one example of the high-frequency composite part according to the preferred embodiment of the present invention, and FIG. 17 is a view showing an equivalent circuit of one example of the high-frequency composite part according to the preferred embodiment of the present invention. This embodiment is concerned about a dual-band, high-frequency composite part for switching a transmitting circuit and a receiving circuit in a plurality of different transmitting/receiving systems. For the simplicity of explanation, EGSM (transmitting frequency: 880–915 MHz, receiving frequency: 925–960 MHz) is taken as an example of the first signal frequency band f1, and DCS1800system (transmitting TX: 1710–1785 MHz, receiving RX: 1805–1880 MHz) is taken as an example of the second signal frequency band f2.

(A) First and Second Filter Circuits

The first and second filter circuits 101, 102 connected to the antenna ANT are each constituted by a distributed constant line and a capacitor. A low-pass filter is used as the first filter circuit 101 for allowing the transmitting and receiving signals of EGSM to pass through while attenuating the transmitting and receiving signals of DCS1800, and a high-pass filter is used as the second filter circuit 102 for allowing the transmitting and receiving signals of DCS1800 to pass through while attenuating the transmitting and receiving signals of EGSM.

The low-pass filter 101 is constituted by a distributed constant line 401 and a capacitor 403 connected in parallel, a capacitor 404 connected to a ground, a distributed constant line 402 and a capacitor 405 connected in parallel, and a capacitor 406 connected to a ground. The high-pass filter 102 is constituted by a distributed constant line 407 and a capacitor 408 connected in parallel, a distributed constant line 409 connected to a ground, and a capacitor 410 connected in series to the distributed constant line 407 and the capacitor 408. With such a structure, receiving signals of the first transmitting/receiving system and the second transmitting/receiving system can be branched. In addition to the above structure, the first and second filter circuits 101, 102 may have the following structures (a)–(h):

(a) A structure in which the first filter circuit 101 is constituted by a low-pass filter, and the second filter circuit 102 is constituted by a notch filter;

(b) A structure in which the first filter circuit 101 is constituted by a notch filter, and the second filter circuit 102 is constituted by a bandpass filter;

(c) A structure in which the first filter circuit 101 is constituted by a low-pass filter, and the second filter circuit 102 is constituted by a bandpass filter;

(d) A structure in which the first filter circuit 101 is constituted by a notch filter, and the second filter circuit 102 is constituted by a notch filter, (e) A structure in which the first filter circuit 101 is constituted by a notch filter, and the second filter circuit 102 is constituted by a high-pass filter, (f) A structure in which the first filter circuit 101 is constituted by a bandpass filter, and the second filter circuit 102 is constituted by a bandpass filter;

(g) A structure in which the first filter circuit 101 is constituted by a bandpass filter, and the second filter circuit 102 is constituted by a notch filter; and (h) A structure in which the first filter circuit 101 is constituted by a bandpass filter, and the second filter circuit 102 is constituted by a high-pass filter.

(B) Signal Line Control Circuit on EGSM Side (1) Signal Line Control Circuit on the Side of EGSM The first signal line control circuit SW1 and the second signal line control circuit SW2 are placed on the downstream side of the first and second filter circuits 101, 102, respectively, the first signal line control circuit SW1 for switching the transmitting circuit TX1 and the receiving circuit RX1 of EGSM comprising a high-frequency amplifier, a diode and a distributed constant line as main constituents, and the second signal line control circuit SW2 for switching the transmitting circuit TX2 and the receiving circuit RX2 of DCS1800 comprising a diode and a distributed constant line as main constituents.

The first signal line control circuit SW1 for switching the transmitting circuit TX1 and the receiving circuit RX1 of EGSM comprises a diode 57 and two distributed constant lines 5, 55 and a high-frequency amplifier 4 as main constituents. The distributed constant line 5 is disposed between the first connection point IP1 and transmitting circuit TX1 in a line for the transmitting and receiving signals of EGSM, and the high-frequency amplifier 4 is connected in series to the downstream side of the distributed constant line 5. The distributed constant line 5 has a line length of substantially $\lambda/4$ in a frequency band of a receiving signal of EGSM. The impedance characteristics of the high-frequency amplifier 4 are such that its impedance is substantially 50 Ω at work while it is substantially short-circuited at a stop. The distributed constant line 55 is connected between the first connection point IP1 and RX1, with one end of the distributed constant line 55 on the side of the receiving circuit RX1 connected to a cathode of the diode 57, with a capacitor 58 connected between the anode of the diode 57 and ground, and with a series circuit comprising an inductor 59 and a resistor 60 connected between the anode of the diode 57 and a control circuit VC1. The distributed constant line 55 has such a line length that its resonance frequency is in a frequency band of a transmitting signal of EGSM.

When the receiving signal of EGSM is sent to the receiving circuit RX1, the impedance characteristics of the high-frequency amplifier 4 at a stop correspond to a substantially short-circuited state without the distributed constant line 5, so that the receiving signal is absorbed in the high-frequency amplifier 4. However, because of the distributed constant line 5, the impedance viewed from the first connection point IP1 is in a substantially open state, to that the receiving signal is sent to the receiving circuit RX1.

Though not shown in FIG. 17, the high-frequency amplifier 4 comprises a capacitor for shutting off the DC signal. With this structure, the DC component from the high-frequency amplifier 4 does not flow into the receiving circuit RX1, and the DC signal in voltage applied by the control circuit VC1 to turn on the diode 57 does not flow into the transmitting circuit TX1.

(C) Signal Line Control Circuit on the Side of DCS1800

The signal line control circuit SW2 for switching the receiving circuit RX2 and the transmitting circuit TX2 of DCS1800 comprises two diodes 306, 309 and two distributed constant lines 301, 307 as main constituents. The diode 306 is placed between the second connection point IP2 through which the transmitting signal and the receiving signals of DCS1800 pass and the transmitting circuit TX2, with its anode connected to the connection point IP2, and with the distributed constant line 301 connected between the cathode of the diode 306 and the ground. The distributed constant line 307 is connected between the connection point IP2 and the receiving circuit RX2, with one end of the distributed constant line 307 on the side of the receiving circuit RX2 connected to the cathode of the diode 309, with the capacitor 310 connected between the anode of the diode 309 and the ground, and with the series circuit comprising an inductor 311 and a resistor 312 connected between the anode of the diode 309 and the control circuit VC2. The distributed constant line 301 has such a line length that resonance frequency with the capacitor 302 is in a frequency band of a transmitting signal of DCS1800.

The low-pass filter circuit is placed between the transmitting circuit TX2 and the connection point IP2. This low-pass filter circuit is preferably a π-type low-pass filter constituted by a distributed constant line 305 and capacitors 302, 303, 304. The low-pass filter circuit is compositely formed between elements constituting the signal line control circuits, though the low-pass filter circuit may be disposed on the input or output side of the signal line control circuit.

To connect the second transmitting circuit TX2 to the second filter circuit 102, positive voltage is applied from the control circuit VC2. With a DC signal removed by capacitors 300, 308, 310, 304, 303, 302, and 410, the positive voltage provided from the control circuit VC2 is applied to a circuit comprising diodes 306, 309 to turn them on. When the diode 306 is in an ON state, impedance is low between the second transmitting circuit TX2 and the connection point IP2. With the diode 309 in an ON state and the capacitor 310, the distributed constant line 307 is grounded at high frequencies, causing resonance, resulting in the extremely high impedance of the second receiving circuit RX2 viewed from the connection point IP2. Accordingly, the transmitting signal from the second transmitting circuit TX2 is transmitted to the second filter circuit 102 without leaking to the second receiving circuit RX2.

When the second receiving circuit RX2 is connected to the second filter circuit 102, zero voltage is applied to the control circuit VC2, putting the diodes 306, 309 in an OFF state. With the diode 309 in an OFF state, the connection point IP2 and the second receiving circuit RX2 are connected via the distributed constant line 307. With the diode 306 in an OFF state, the impedance of the second transmitting circuit TX2 is high when viewed from the side of the connection point IP2. Accordingly, the receiving signal from the second filter circuit 102 is sent to the second receiving circuit RX2 without leaking to the second transmitting circuit TX2.

The above control of high-frequency signal lines can be carried out by controlling the operation states of the control circuits VC1, VC2 and the high-frequency amplifier as shown in Table 1 to change the transmitting/receiving modes of EGSM and DCS1800.

TABLE 1

| Mode | VC1 | VC2 | High-Frequency Amplifier |
| --- | --- | --- | --- |
| EGSM TX | High | Low | At work |
| EGSM RX | Low | Low | At stop |
| DCS1800 TX | Low | High | At stop |
| DCS1800 RX | Low | Low | At stop |

(D) Multi-Layered Structure of High-Frequency Composite Part

Figure 19:
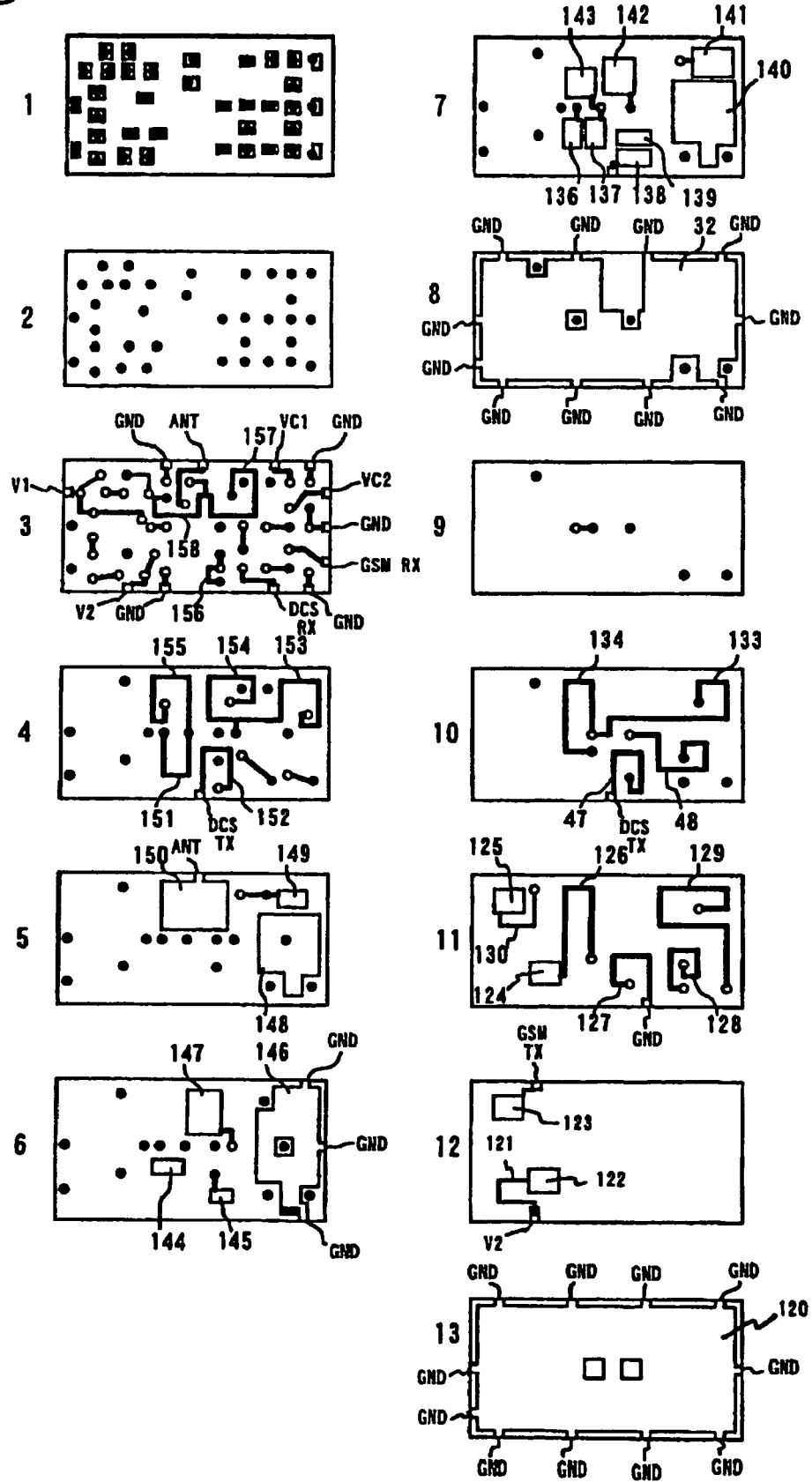
FIG. 19 is an open view showing a circuit structure of each layer constituting a multilayered module for the dual-band, high-frequency composite part of the present invention.

FIG. 18 is a plan view showing the high-frequency composite part of the present embodiment, and FIG. 19 is a view showing the structure of each layer constituting the multi-layered module of FIG. 18. In this embodiment, the first and second filter circuits, the low-pass filter circuits, the distributed constant line of the signal line control circuit and the inductors and capacitors of the matching circuit of the high-frequency amplifier are formed in the multi-layered module, while diodes, semiconductor chips of the high-frequency amplifier, and high-capacitance capacitors, resistors and inductors that cannot be contained in the multi-layered module are mounted as chip parts onto the multi-layered module, thereby constituting a one-chip-type, dual-band, high-frequency composite part.

This multi-layered module is produced by forming green sheets of 10 μm to 500 μm in thickness made of a low-temperature sinterable ceramic dielectric material, printing an Ag-based conductive paste on each green sheet to form a desired electrode pattern, integrally laminating a plurality of green sheets with electrode patterns, and then sintering the resultant laminate. Most line electrodes preferably have a width of 100 μm to 400 μm. The internal structure of the multi-layered module will be explained in the order of lamination.

The lowermost green sheet 13 is provided substantially on an entire surface with a ground electrode 120, which has extensions for connecting to terminal electrodes formed on the side surface.

A green sheets 12 provided with capacitor electrodes 122, 123 and a line electrode 121 for constituting the input-matching circuit and output-matching circuit of the high-frequency amplifier, a green sheet 11 provided with five line electrodes 126, 127, 128, 129, 130 and capacitor electrodes 124, 125, and a green sheet 10 provided with four line electrodes 47, 48, 133, 134 are successively laminated on the green sheet 13 laminated thereon are a green sheet 9 provided with five through-hole electrodes (shown by black circles in the view), and then a green sheet 8 provided with five through-hole electrodes and a ground electrode 32.

Line electrodes are connected in regions sandwiched by two ground electrodes 120, 32. Specifically, the line electrodes 126 and 134 are connected via through-hole electrodes to constitute part of the distributed constant line 5; the line electrodes 129 and 133 are connected via through-hole electrodes to constitute the distributed constant line 55; the line electrodes 128 and 48 are connected via through-hole electrodes to constitute the distributed constant line 307; and the line electrodes 127 and 47 are connected via through-hole electrodes to constitute the distributed constant line 301. The line electrode 121 constitutes a distributed constant line 20 for the output-matching circuit 26 of the high-frequency amplifier 4; the capacitor electrode 122 and the ground electrode 120 constitutes the capacitor 21 of the output-matching circuit 26; the capacitor electrode 123 and the ground electrode 120 constitutes a capacitor 18 for the input-matching circuit 23 of the high-frequency amplifier 4; the capacitor electrode 122 and the capacitor electrode 124 constitutes a DC-cutting capacitor 22 of the high-frequency amplifier 4; and the capacitor electrode 123 and the capacitor electrode 125 constitutes a DC-cutting capacitor 17 of the high-frequency amplifier 4. The line electrode 130 constitutes the distributed constant line 19 of the input-matching circuit 23.

In this embodiment, capacitors for the input-matching circuit 23 and output-matching circuit 26 of the high-frequency amplifier 4 are formed in multi-layered module, though the above capacitors may be mounted onto the multi-layered module as chip capacitors to have properly desired capacitance if fine adjustment is needed.

A green sheet 7 laminated on the green sheet 8 is provided with capacitor electrodes 136, 137, 138, 139, 140, 141, 142 and 143. A green sheet 6 laminated thereon is provided with capacitor electrodes 144, 145, 147 and a ground electrode 146. A green sheet 5 laminated thereon is provided with capacitor electrodes 148, 149, 150 laminated thereon are a green sheet 4 provided with line electrodes 151, 152, 153, 154, 155, a green sheet 3 provided with line electrodes 156, 157, 158 and connection lines, and a green sheet 2 provided with through-hole electrodes. The uppermost green sheet 1 is provided with lands for mounting elements.

Capacitor electrodes 136, 137, 138, 139, 140, 141, 143 on the green sheet 7 laminated on the green sheet 8 having an upper ground electrode 32 constitutes capacitors with the ground electrode 32. Specifically, the capacitor electrode 143 constitutes a capacitor 404; the capacitor electrode 136 constitutes a capacitor 406; the capacitor electrode. 140 constitutes a capacitor 58; the capacitor electrode 138 constitutes a capacitor 302; the capacitor electrode 139 constitutes a capacitor 303; and the capacitor electrode 141 constitutes a capacitor 310.

Capacitor electrodes formed on the green sheets 5, 6, 7 constitute capacitance with each other. Specifically, a capacitor 410 is constituted between the capacitor electrodes 142 and 147; a capacitor 408 is constituted between the capacitor electrodes 147 and 150, a capacitor 405 is constituted between the capacitor electrodes 137, 136 and 144; a capacitor 304 is constituted between the capacitor electrodes 138, 139 and 145. Further, parasitic capacitance between the line electrodes 155 and 158 constitutes a capacitor 403 in the equivalent circuit.

Line electrodes 155, 158 constitute the distributed constant line 401 in the green sheets 3, 4; line electrodes 154, 157 constitute the distributed constant line 407, line electrode 153 constitute the distributed constant line 409; line electrodes 152, 156 constitute the distributed constant line 305; and a line electrode 151 constitutes the distributed constant line 402. Lines on the green sheet 3 except for the line electrodes 156, 157, 158 are wiring lines.

These green sheets are pressure-bonded and integrally sintered to provide a multi-layered module 170 of 9.6 mm×5.0 mm×1.0 mm in outer dimension. This multi-layered module 170 is provided with terminal electrodes on the side surface. As shown in FIG. 18, mounted onto this multi-layered module are diodes 57, 306, 309, a transistor 27, chip capacitors 56, 308, 411, chip inductors 59, 311 and capacitors, resistors and inductors for constituting the stabilizing circuit of the high-frequency amplifier. Incidentally, GND denotes a ground terminal.

In this embodiment, distributed constant lines for the first and second signal line control circuits are formed in the multi-layered module in regions sandwiched by the ground electrodes. With this structure, interference between the signal line control circuits, the branching circuits (diplexer) and the low-pass filter circuits is prevented. Because regions sandwiched by the ground electrodes are located in a lower portion of the multi-layered module, it is easy to get a ground potential. In this embodiment, the multi-layered module is provided with each terminal on the side surface to have such a structure as to enable surface mounting. The terminals on the side surface are an ANT terminal, a TX2 terminal of DCS 1800, a TX1 terminal of EGSM, an RX1 terminal of EGSM, an RX2 terminal of DCS1800, a ground terminal GND, and control terminals VC1, VC2. In place of the terminals on the side surface, internal wiring may be led to the bottom surface of the multi-layered module via through-holes as terminals of BGA (Ball Grid Array), LGA (Land Grid Array), etc.

When the high-frequency composite part of the present invention is used for a dual-band mobile phone, small battery consumption has been confirmed, resulting in mobile phones with low current consumption. As long as the high-frequency composite part comprises a combination of a high-frequency amplifier and a phase-shifting circuit as a transmitting signal control means, it is within the range of the present invention.

Figure 16:
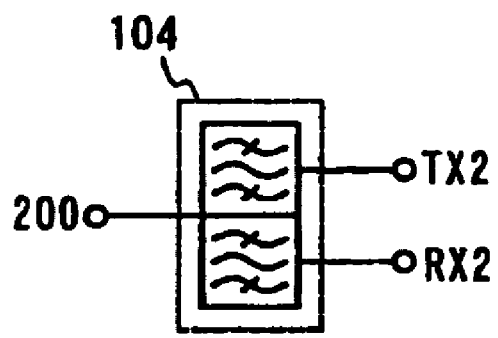
FIG. 16 is a block diagram showing one example of a duplexer used in the dual-band, high-frequency composite part of the present invention.

Though the structure and operation of the high-frequency composite part of the present invention has been explained with respect to the dual-band system of EGSM and DCS1800, the use of a duplexer comprising a combination of two filters as shown in FIG. 16 in place of the second signal line control circuits can provide a dual-mode high-frequency composite part, for instance, for a TDMA system such as EGSM and a CDMA system such as W-CDMA (wideband CDMA), and a wireless communications device such as a mobile phone, etc. comprising such a high-frequency composite part.

What is claimed is:

1. A high-frequency composite part for controlling the connection between a transmitting circuit and an antenna, and the connection between a receiving circuit and said antenna comprising:
   a plurality of filter circuits having different passbands;
   an amplifier circuit comprising a transistor, an input terminal, and an output terminal;
   an input-matching circuit connected to the input terminal of said amplifier circuit;
   an output-matching circuit connected to the output terminal of said amplifier circuit;
   a phase-shifting circuit controlling the phase angle of a high-frequency signal connected to said output-matching circuit;
   a high-frequency switch circuit;
   said filter circuits each comprising an inductor and a capacitor;
   said input-matching circuit and said output-matching circuit each comprising an inductor and a capacitor;
   said phase-shifting circuit comprising a distributed constant line; and
   said high-frequency switch circuit comprising a diode and an inductor,
   wherein said amplifier circuit, said input-matching circuit, said output-matching circuit, said phase-shifting circuit, said high-frequency switch circuit, and at least parts of inductors and capacitors of said filter circuits are integrated in a multi-layered module laminated by a plurality of dielectric layers and electrode patterns formed thereon,
   wherein said distributed constant line constituting said phase-shifting circuit are formed by said electrode patterns, and chips of the other parts of inductors and capacitors, said diode and said transistor are mounted on said multi-layered module, and wherein said electrode patterns are led to side surfaces of said multi-layered module to connect with edge terminals formed on the side surfaces thereof so as to enable surface mounting.

2. The high-frequency composite part according to claim 1, wherein a cavity is provided with said multi-layered module, said transistor is mounted in said cavity, and the opening of said cavity is sealed with plastics.

3. The high-frequency composite part according to claim 1, wherein a via-hole is provided with said multi-layered module for heat dissipation, and said transistor is disposed on said via-hole.

4. The high-frequency composite part according to claim 1, wherein said transistor is subjected to flip chip bonding.

5. A high-frequency composite part for controlling the connection between a transmitting circuit and an antenna, and the connection between a receiving circuit and said antenna comprising:
   a plurality of filter circuits having different passbands;
   an amplifier circuit comprising a transistor;
   an input-matching circuit connected to the input terminal of said amplifier circuit;
   an output-matching circuit connected to the output terminal of said amplifier circuit;
   a phase-shifting circuit controlling the phase angle of the high-frequency signal connected to said output-matching circuit, and
   a high-frequency switch circuit;
   said filter circuits each comprising an inductor and a capacitor;
   said input-matching circuit and said output-matching circuit each comprising an inductor and a capacitor;
   said phase-shifting circuit comprising a distributed constant line; and
   said high-frequency switch circuit comprising a diode and an inductor,
   wherein said filter circuits, said amplifier circuit, said input-matching circuit, said output matching circuit, said phase-shifting circuit and said high-frequency switch circuit are integrated in a multi-layered module laminated by a plurality of dielectric layers and electrode patterns formed thereon,
   wherein said distributed constant line constituting said phase-shifting circuit are formed by said electrode patterns, and chips of the other parts of inductors and capacitors, said diode and said transistor are mounted on said multi-layered module, and wherein said electrode patterns are led to the bottom surface of the multi-layered module via through-holes as terminals of BGA (Ball Grid Array) or LGA (Land Grid Array) so as to enable surface mounting.

6. The high-frequency composite part according to claim 5, wherein said multi-layered module comprises a plurality of ground electrodes formed by electrode patterns electrically connected to one another, and inductors and/or capacitors constituting said filter circuits, said amplifier circuit, said input-matching circuit, said output-matching circuit, said phase-shifting circuit and said high-frequency switch circuit are ground to any one of said ground electrodes.

7. The high-frequency composite part according to claim 5, wherein said phase-shifting circuit is a directional coupler.

8. The high-frequency composite part according to claim 5, wherein said phase-shifting circuit is a low-pass filter.

* * * * *

UNITED STATES PATENT AND TRADEMARK OFFICE
CERTIFICATE OF CORRECTION

| | | |
|---|---|---|
| PATENT NO. | : 7,026,887 B2 | Page 1 of 1 |
| APPLICATION NO. | : 10/972004 | |
| DATED | : April 11, 2006 | |
| INVENTOR(S) | : Mitsuhiro Watanabe et al. | |

It is certified that error appears in the above-identified patent and that said Letters Patent is hereby corrected as shown below:

On the title page, item (30) insert --March 15, 2000    (JP)………..2000-72319-- after "Nov. 1, 2000          (JP)……………………………..…..2000-334621"

Signed and Sealed this

Twenty-third Day of January, 2007

JON W. DUDAS
*Director of the United States Patent and Trademark Office*